United States Patent
Amanokura et al.

(10) Patent No.: US 8,821,750 B2
(45) Date of Patent: Sep. 2, 2014

(54) METAL POLISHING SLURRY AND POLISHING METHOD

(75) Inventors: Jin Amanokura, Hitachi (JP); Takafumi Sakurada, Hitachi (JP); Sou Anzai, Mito (JP); Takashi Shinoda, Hitachi (JP); Shigeru Nobe, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 62 days.

(21) Appl. No.: 12/527,607

(22) PCT Filed: Feb. 22, 2008

(86) PCT No.: PCT/JP2008/053065
§ 371 (c)(1),
(2), (4) Date: Aug. 18, 2009

(87) PCT Pub. No.: WO2008/105342
PCT Pub. Date: Sep. 4, 2008

(65) Prior Publication Data
US 2010/0120250 A1     May 13, 2010

(30) Foreign Application Priority Data

Feb. 27, 2007 (JP) ................................. 2007-047007
May 10, 2007 (JP) ................................. 2007-125840

(51) Int. Cl.
*C09G 1/02* (2006.01)
*C23F 1/18* (2006.01)
*C23F 1/26* (2006.01)
*H01L 21/304* (2006.01)
*H01L 21/306* (2006.01)

(52) U.S. Cl.
CPC ... *C09G 1/02* (2013.01); *C23F 1/18* (2013.01); *C23F 1/26* (2013.01); *H01L 21/30625* (2013.01)
USPC .......... 252/79.1; 252/79.2; 252/79.4; 216/89; 438/633; 438/687; 438/693

(58) Field of Classification Search
USPC ................ 438/693, 692, 633; 252/79.1, 79.2, 252/79.4; 451/36, 37
See application file for complete search history.

(56) References Cited

U.S. PATENT DOCUMENTS 4,944,836 A     7/1990 Beyer et al.
5,527,370 A *   6/1996 Kubo et al. ..................... 51/309
(Continued)

FOREIGN PATENT DOCUMENTS

CN     1240695 A     1/2000
CN     1420917 A     5/2003
(Continued)

OTHER PUBLICATIONS

Steigerwald et al., "Chemical Mechanical Planarization of Microelectronics Materials", Wiley, 2004, pp. 36-46.*
Chinese Office Action dated May 11, 2010, issued in corresponding Chinese Patent Application No. 200880005185.8.
F.B. Kaufman, et al., "Chemical-Mechanical Polishing for Fabricating Patterned W Metal Features as Chip Interconnects", J. Electrochem. Soc., Nov. 1991, pp. 3460-3465, vol. 138, No. 11.

(Continued)

*Primary Examiner* — Anita Alanko
(74) *Attorney, Agent, or Firm* — Westerman, Hattori, Daniels & Adrian, LLP

(57) ABSTRACT

The present invention relates to a metal polishing slurry containing abrasive grains, a metal-oxide-dissolving agent, and water, wherein the abrasive grains contain two or more abrasive grain species different from each other in average secondary particle diameter. Using the metal polishing slurry of the present invention, a metal polishing slurry can be obtained which gives a large polishing rate of an interlayer dielectric layer, and is high in the flatness of the polished surface. This metal polishing slurry can provide suitable method for a semiconductor device which is excellent in being made finer and thinner and in dimension precision and in electric characteristics, is high in reliability, and can attain a decrease in costs.

21 Claims, 1 Drawing Sheet

(56) References Cited

U.S. PATENT DOCUMENTS

| | | | |
|---|---|---|---|
| 6,143,662 A * | 11/2000 | Rhoades et al. | 438/690 |
| 6,924,227 B2 * | 8/2005 | Minamihaba et al. | 438/633 |
| 8,304,346 B2 * | 11/2012 | Yoshida et al. | 438/693 |
| 2003/0061766 A1 * | 4/2003 | Vogt et al. | 51/308 |
| 2003/0124852 A1 * | 7/2003 | Fang et al. | 438/689 |
| 2003/0200702 A1 * | 10/2003 | Lee et al. | 51/298 |
| 2005/0181609 A1 * | 8/2005 | Kurata et al. | 438/689 |
| 2005/0198912 A1 * | 9/2005 | Kim et al. | 51/307 |
| 2005/0227451 A1 * | 10/2005 | Konno et al. | 438/424 |
| 2006/0243702 A1 * | 11/2006 | Minamihaba et al. | 216/88 |
| 2007/0037892 A1 * | 2/2007 | Belov | 516/79 |
| 2007/0075041 A1 * | 4/2007 | Ishibashi et al. | 216/88 |
| 2007/0196975 A1 * | 8/2007 | Nomura et al. | 438/230 |
| 2008/0207091 A1 * | 8/2008 | Jeng et al. | 451/37 |

FOREIGN PATENT DOCUMENTS

| | | | |
|---|---|---|---|
| CN | 1683465 A | 10/2005 | |
| JP | 02-278822 A | 11/1990 | |
| JP | 08-083780 A | 3/1996 | |
| JP | 2001-72962 A | 3/2001 | |
| JP | 2001-189295 A | 7/2001 | |
| JP | 2002-141314 A | 5/2002 | |
| JP | 2003-113369 A | 4/2003 | |
| JP | 2003-347248 A | 12/2003 | |
| JP | 2005-285944 A | 10/2005 | |
| JP | 2005-302973 A | 10/2005 | |
| JP | 2005-302974 A | 10/2005 | |
| JP | 2006-128552 A | 5/2006 | |
| JP | 2006-147993 A | 6/2006 | |
| JP | 2007-12679 A | 1/2007 | |
| TW | 200537614 | 11/2005 | |
| WO | 2005/101474 A1 | 10/2005 | |

OTHER PUBLICATIONS

International Search Report of PCT/JP2008/053065, Mailing Date of May 20, 2008.

Notification of Transmittal of Translation of the International Preliminary Report on Patentability (Form PCT/IB/338) of International Application No. PCT/JP2008/053065 dated Sep. 11, 2009, with Forms PCT/IB/373 and PCT/ISA/237.

Japanese Office Action dated Jun. 5, 2012, issued in corresponding Japanese Patent Application No. 2009-501221.

Chinese Office Action dated Dec. 6, 2011, issued in corresponding Chinese Patent Application No. 2008800051858.

Chinese Office Action dated Aug. 29, 2012, issued in corresponding Chinese Patent Application No. 200880005185.8 (12 pages) with English Translation.

Japanese Office Action dated Jan. 15, 2013, issued in corresponding Japanese Patent Application No. 2009-501221, w/ English translation.

Chinese Office Action dated Mar. 13, 2013, issued in corresponding Chinese Patent Application No. 200880005185.8, w/ English translation.

Taiwanese Office Action dated Feb. 27, 2013, issued in corresponding Taiwanese Patent Application No. 097106916, w/ English translation.

Japanese Office Action dated Aug. 27, 2013, issued in corresponding Japanese Patent Application No. 2012-157758, w/ English translation.

Chinese Office Action dated Dec. 6, 2013, issued in corresponding Chinese application No. 201210144194.3, w/ partial English translation (10 pages).

Office Action dated Feb. 25, 2014, issued in Korean Patent Application No. 10-2009-7016963 with Partial English Translation (5 pages).

* cited by examiner

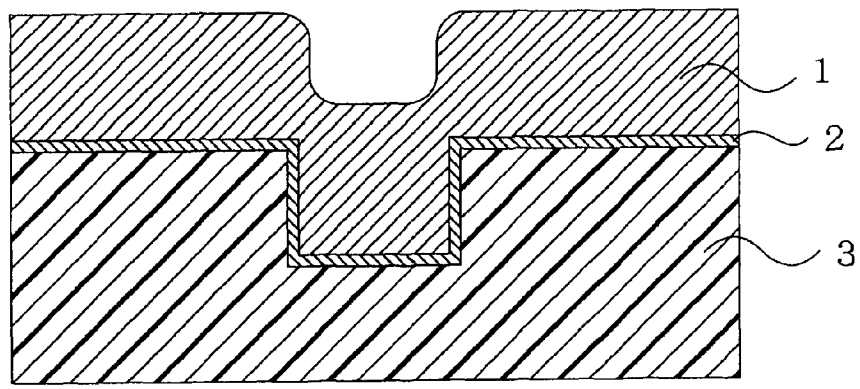
(a)
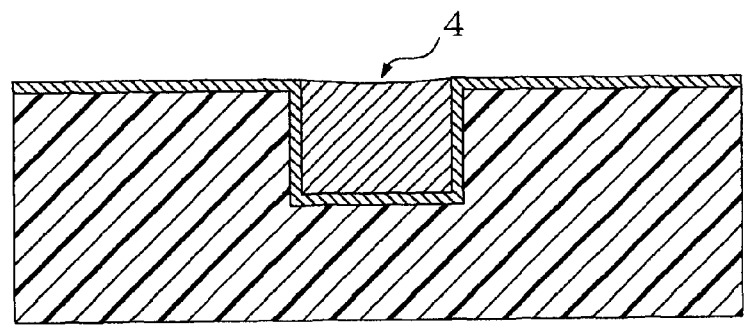
(b)
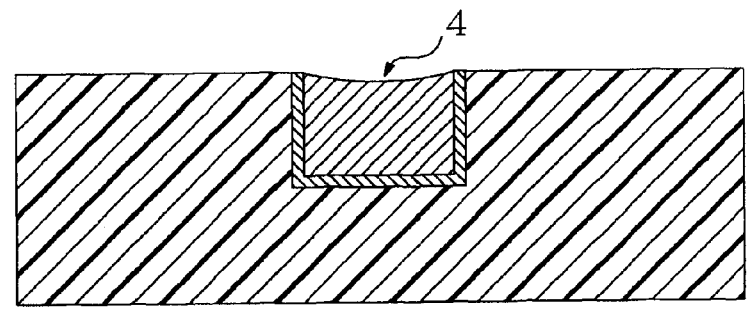
(c1)
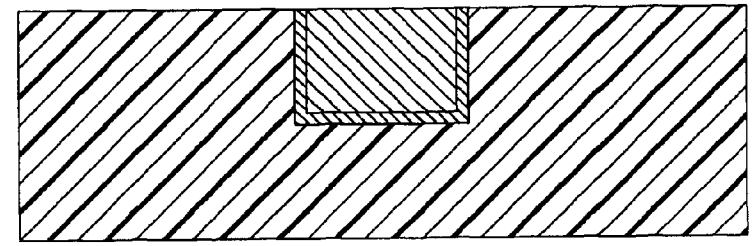
(c2)

METAL POLISHING SLURRY AND POLISHING METHOD

TECHNICAL FIELD

The present invention relates to a metal polishing slurry, and a polishing method.

BACKGROUND ART

In recent years, new fine processing technologies have been developed as the integration degree of semiconductor integrated circuits (hereinafter referred to as LSIs) and the performance thereof have been becoming high. Chemical mechanical polishing (hereinafter referred to as CMP) is also one of the technologies, and is a technique used frequently in the process of producing LSIs, in particular, in the planarization of an interlayer dielectric layer, the formation of metallic plugs, or the formation of embedded interconnections in a multilayer interconnection forming step. This technique is disclosed in, for example, the specification of U.S. Pat. No. 4,944,836.

In order to make the performance of LSIs high, attempts of making use of copper or copper alloy as an electroconductive material which is to be a wiring material have been recently made. However, copper or copper alloy is not easily subjected to fine processing based on dry etching, which is frequently used to form conventional aluminum alloy wiring. Thus, the so-called damascene process is mainly adopted, which is a process of depositing a copper or copper alloy thin film on an insulating film in which grooves are beforehand made, so as to embed the film therein, and then removing the thin film in any region other than the groove regions by CMP to form embedded wiring. This technique is disclosed in, for example, JP-A-2-278822.

An ordinary method of CMP for polishing a metal for wiring regions, such as copper or copper alloy, is a method of causing a polishing pad to attach onto a circular polishing table (platen), impregnating the surface of the polishing pad with a metal polishing slurry, pushing a metal-film-formed surface of a substrate against it, and rotating the polishing table in the state that a predetermined pressure (hereinafter referred to as a polishing pressure) is applied thereto from the rear surface of the polishing pad, thereby removing convex portions of the metallic film by effect of mechanical friction between the polishing slurry and the metallic film convex portions.

A metal polishing slurry used for CMP is generally composed of an oxidizing agent, abrasive grains, and water. If necessary, a metal-oxide-dissolving agent, a metal anticorrosive agent, and others are added thereto. The surface of a metallic film is first oxidized with the oxidizing agent to form an oxide layer, and the oxide layer is ground away with the abrasive grains. This is considered to be a basic mechanism. The oxide layer in concave regions of the metallic film surface does not contact the polishing pad very much; thus, the grinding-away effect of the abrasive grains is not given thereto. Therefore, with the advance of CMP, the metallic film convex regions are removed so that the substrate surface is planarized. Details thereof are disclosed in Journal of Electrochemical Society, Vol. 138, No. 11 (1991), 3460-3464.

It is mentioned that an effective method for making the polishing rate of CMP high is the addition of a metal-oxide-dissolving agent. This can be interpreted as follows: when grains of a metal oxide ground away with the abrasive grains are dissolved into the polishing slurry, the grinding-away effect of the abrasive grains increases. The addition of the metal-oxide-dissolving agent causes an improvement in the polishing rate of CMP; however, when an oxide layer in concave regions of a metallic film surface is also dissolved so that the metallic film surface is made naked, the metallic film surface is further oxidized with the oxidizer. When this is repeated, the dissolution of the metallic film concave regions unfavorably advances. As a result, there is generated a phenomenon that a central region of the surface of metallic wiring embedded after the polishing is depressed into a dish form (hereinafter, the phenomenon will be referred to as "dishing"). Thus, the planarizing effect is damaged.

In order to prevent this, a metal anticorrosive agent is further added to the metal polishing slurry. The metal anticorrosive agent is an agent for forming a protective film on the oxide layer on the metallic film surface to prevent the oxide layer from being etched.

This protective film can easily be ground away with the abrasive grains. It is desired that the protective film does not cause a fall in the polishing rate of CMP.

In order to restrain the dishing or etching of a metallic film to form LSI wiring high in reliability, suggested is a method using a metal polishing slurry containing a metal-oxide-dissolving agent made of an aminoacetic acid, such as glycine, or amidesulfuric acid, and benzotriazole as a metal anticorrosive agent. This technique is described in, for example, JP-A-8-83780.

Beneath a metal for wiring regions, such as copper or copper alloy, a layer made of a conductor such as tantalum or a tantalum compound is formed as a barrier layer in order to prevent the metal from diffusing into the interlayer dielectric layer, or improve the adhesive property of the metal onto the interlayer dielectric layer. It is therefore necessary to make use of CMP to remove the barrier layer naked in any region other than the wiring regions into which the wiring region metal such as copper or copper alloy is to be embedded. However, the conductor of the barrier layer is higher in hardness than copper or copper alloy; therefore, a combination of polishing materials for copper or copper alloy does not give a sufficient polishing rate and further makes the flatness and smoothness of the polished surface poor in many cases. Thus, a two-stage polishing method is being investigated which is composed of a first CMP polishing step for polishing the wiring region metal such as copper or copper alloy, and a second CMP polishing step for polishing the barrier layer.

The metal polishing slurry used in the second CMP polishing step for polishing the barrier layer may be required to attain ability to polish a silicon-coating film or an organic polymer film, which is an interlayer dielectric layer in order to promote the planarization of the polished surface. In order to improve the polishing rate of the interlayer dielectric layer, suggested is a method of enlarging the particle diameter of the abrasive grains contained in the metal polishing slurry to perform polishing. However, the method has a problem that scratches are generated in the surface polished therewith, thereby causing electric characteristic insufficiency. There is also caused a problem that such electric characteristic insufficiency is generated by insufficient washing after the CMP.

DISCLOSURE OF THE INVENTION

An object of the invention is to provide a metal polishing slurry which gives a large polishing rate of an interlayer dielectric layer, produces no scratches on a polished surface, and makes the flatness and smoothness of the polished surface high. Another object of the invention is to provide a polishing method which is suitable for a highly reliable and low-cost semiconductor device excellent in being made finer and thinner and in dimension precision and electric characteristics, by using the metal polishing slurry.

The invention relates to (1) a metal polishing slurry containing abrasive grains, a metal-oxide-dissolving agent, and water, wherein the abrasive grains contain two or more abrasive grain species different from each other in average secondary particle diameter.

The invention also relates to (2) the metal polishing slurry according to item (1), wherein the average secondary particle diameter of the abrasive grains is in the range of 1 to 1000 nm.

The invention also relates to (3) the metal polishing slurry according to item (1), wherein the abrasive grains contain first abrasive grains having an average secondary particle diameter being in the range of 5 to 39 nm, and second abrasive grains having an average secondary particle diameter being in the range of 40 to 300 nm.

The invention also relates to (4) the metal polishing slurry according to item (1), wherein the abrasive grains contain abrasive grains having an average primary particle diameter being in the range of 2 to 100 nm.

The invention also relates to (5) the metal polishing slurry according to any one of items (1) to (4), wherein a pH is in the range of 2 to 5.

The invention also relates to (6) the metal polishing slurry according to any one of items (1) to (5), wherein the abrasive grains are made of at least one selected from silica, alumina, ceria, titania, zirconia and germania.

The invention also relates to (7) the metal polishing slurry according to any one of items (1) to (6), wherein the metal-oxide-dissolving agent is at least one selected from organic acids, organic-acid esters, ammonium salts of organic acids, and inorganic acids.

The invention also relates to (8) the metal polishing slurry according to any one of items (1) to (7), which further contains a metal oxidizing agent.

The invention also relates to (9) the metal polishing slurry according to item (8), wherein the metal oxidizing agent is at least one selected from hydrogen peroxide, nitric acid, potassium periodate, hypochlorous acid, and ozone water.

The invention also relates to (10) the metal polishing slurry according to any one of items (1) to (9), which further contains a metal anticorrosive agent.

The invention also relates to (11) the metal polishing slurry according to any one of items (1) to (10), which further contains an organic solvent.

The invention also relates to (12) the metal polishing slurry according to item (11), wherein the organic solvent is at least one selected from glycol ether compounds, alcohol compounds, and carbonate compounds.

The invention also relates to (13) the metal polishing slurry according to any one of items (1) to (12), which further contains a polymer having a weight-average molecular weight of 500 or more.

The invention also relates to (14) the metal polishing slurry according to any one of items (1) to (13), wherein a polishing-receiving film to be polished with the metal polishing slurry is a polishing-receiving film containing an electroconductive material layer and a metal barrier layer.

The invention also relates to (15) the metal polishing slurry according to any one of items (1) to (13), wherein a polishing-receiving film to be polished with the metal polishing slurry is a polishing-receiving film containing an electroconductive material layer and an interlayer dielectric layer.

The invention also relates to (16) the metal polishing slurry according to any one of items (1) to (13), wherein a polishing-receiving film to be polished with the metal polishing slurry is a polishing-receiving film containing a metal barrier layer and an interlayer dielectric layer.

The invention also relates to (17) the metal polishing slurry according to any one of items (1) to (13), wherein a polishing-receiving film to be polished with the metal polishing slurry is a polishing-receiving film containing an electroconductive material layer, a metal barrier layer and an interlayer dielectric layer.

The invention also relates to (18) the metal polishing slurry according to any one of item (14), (15) or (17), wherein the electroconductive material layer is a layer containing at least one selected from copper, copper alloys, copper oxides, and copper alloy oxides.

The invention also relates to (19) the metal polishing slurry according to any one of item (14), (16) or (17), wherein the metal barrier layer is a single layer or a lamination made of two or more layers, and the layer(s) contain(s) at least one selected from tantalum, tantalum compounds, titanium, titanium compounds, tungsten, tungsten compounds, ruthenium, ruthenium compounds, copper-manganese alloys, and copper-manganese-silicon oxide alloys.

The invention also relates to (20) the metal polishing slurry according to any one of items (15) to (17), wherein the interlayer dielectric layer is a silicon-coating film or an organic polymer film.

The invention also relates to (21) the metal polishing slurry according to any one of items (1) to (20), wherein the amount of the abrasive grains is from 0.001 to 50 parts by mass, based on 100 parts by mass of the whole of the metal polishing slurry.

The invention also relates to (22) the metal polishing slurry according to any one of items (15), and (17) to (21), wherein the ratio between the polishing rate of the electroconductive material layer and that of the interlayer dielectric layer is 0.72 or less.

The invention also relates to (23) a polishing method, comprising the step of polishing a polishing-receiving film while supplying the metal polishing slurry according to any one of (1) to (22), onto a polishing cloth of a polishing table by moving the polishing table and a substrate having the polishing-receiving film relatively to each other in the state that the substrate is pushed and pressed onto the polishing cloth.

BRIEF DESCRIPTION OF THE DRAWINGS

FIG. 1 are views referred to in order to describe polishing steps wherein the metal polishing slurry of the invention is used.

BEST MODE FOR CARRYING OUT THE INVENTION

A member to be polished in the invention is a patterned substrate which has undergone a first CMP polishing step. Specifically, the member is a desired patterned substrate obtained by: preparing a substrate having an interlayer dielectric layer having a surface composed of concave and convex regions, a metal barrier layer which covers the interlayer dielectric layer along its surface, and an electroconductive material layer which is filled into the concave regions to cover the metal barrier layer; and polishing the electroconductive material layer through a first CMP polishing step, thereby making the metal barrier layer on the convex regions naked, and causing the electroconductive material layer in the concave regions to remain. The metal polishing slurry of the invention is a slurry used in a second CMP polishing step.

The metal polishing slurry of the invention contains abrasive grains, a metal-oxide-dissolving agent, and water, wherein the abrasive grains contain two or more abrasive grain species different from each other in average secondary particle diameter. In the invention, a metal oxidizing agent, a metal anticorrosive agent, an organic solvent, and/or a polymer having a weight-average molecular weight of 500 or more may be added thereto if necessary.

The abrasive grains used in the metal polishing slurry of the invention is, for example, inorganic abrasive grains made of silica, alumina, zirconia, ceria, titania, germania, silicon carbide or the like, or organic abrasive grains made of polystyrene, acrylic polymer, polyvinyl chloride or the like. Of these materials, preferred are silica, alumina, zirconia, ceria, titania and germania. More preferred is silica or alumina, and particularly preferred is colloidal silica or colloidal alumina.

Abrasive grains having an average secondary particle diameter being the range of 1 to 1000 nm are preferred, abrasive grains having an average secondary particle diameter being the range of 3 to 300 nm are more preferred, colloidal silica or colloidal alumina having an average secondary particle diameter being the range of 1 to 1000 nm are even more preferably preferred, and colloidal silica or colloidal alumina having an average secondary particle diameter being the range of 3 to 300 nm are particularly preferred since good dispersive stability in the metal polishing slurry is obtained and the generation number of scratches generated therewith in CMP is small.

The invention is characterized by containing two or more abrasive grain species different from each other in average secondary particle diameter of the abrasive grains, thereby making it possible to improve the polishing rate of an interlayer dielectric layer. A preferred example of the abrasive grains containing two or more abrasive grain species different from each other in average secondary particle diameter is grains containing first abrasive grains having an average secondary particle diameter being in the range of 5 to 39 nm, and second abrasive grains having an average secondary particle diameter being in the range of 40 to 300 nm. A more preferred example thereof is grains containing first abrasive grains having an average secondary particle diameter being in the range of 10 to 39 nm, and second abrasive grains having an average secondary particle diameter being in the range of 40 to 150 nm. An even more preferred example thereof is grains containing first abrasive grains having an average secondary particle diameter being in the range of 12 to 39 nm, and second abrasive grains having an average secondary particle diameter being in the range of 40 to 90 nm. In a preferred embodiment of the abrasive grains, three or more abrasive grain species different from each other in average secondary particle diameter are contained as well as two or more grain species different from each other therein are contained. In this case, the abrasive grain species with the average secondary particle diameters of which are successively arranged from the smallest value toward the largest value, are defined as first abrasive grains, second abrasive grains, third abrasive grains, . . . . When the third abrasive grains and so on are also added, the average secondary particle diameter of each of the grain species and the average secondary particle diameter of the whole of the abrasive grains are each preferably in the range of 1 to 1000 nm. By combining two or more abrasive grain species each having an average secondary particle diameter in that range, the abrasive grains turn into a closest packing state when the abrasive grains contact a surface to be polished in polishing. Thus, the polishing rate of an interlayer dielectric layer can be made better and further the generation of scratches can be prevented. The two or more abrasive grain species different from each other in average secondary particle diameter may be a combination of the same kind of abrasive grains or different kinds of abrasive grains.

In the case of using two abrasive grain species different from each other in average secondary particle diameter, a sufficiently polishing rate for an interlayer dielectric layer may not be obtained if the average secondary particle diameter of the first abrasive grains is 5 nm or less. If the second abrasive grains having an average secondary particle diameter is in the range of 300 nm or more, the dispersibility may deteriorate and scratches may be generated. From this viewpoint, the largest value of the average secondary particle diameter of the second abrasive grains is preferably 150 nm or less, more preferably 90 nm or less.

The abrasive grains used in the invention are abrasive grains containing abrasive two or more grain species different from each other in average secondary particle diameter. It is preferred that the content by percentage of the second abrasive grains, which have a larger average secondary particle diameter, is larger. For example, preferred are abrasive grains containing 1 to 50% by mass of first abrasive grains having an average secondary particle diameter being in the range of 5 to 39 nm and 50 to 99% by mass of second abrasive grains having an average secondary particle diameter being in the range of 40 to 300 nm to whole abrasive grains. If the content by percentage of the first abrasive grains, which has an average secondary particle diameter being in the range of 5 to 39 nm, is less than 1% by mass, the polishing rate of a blanket substrate on which an organic silicate glass or silicon dioxide that is used as an interlayer dielectric layer is formed, tends to be small. If the content by percentage is more than 50% by mass, the polishing rate of a blanket substrate on which a silicon-coating film or organic polymer film that is used as an interlayer dielectric layer is formed, also tends to be small.

When three or more abrasive grain species different from each other in average secondary particle diameter are contained, it is preferred that large abrasive grains which have an average secondary particle diameter being in the range of 1 to 1000 nm are contained in a larger amount since the Mechanical effect becomes large so that the polishing rate becomes large.

In the invention, the average primary particle diameter of the abrasive grains is preferably in the range of 2 to 100 nm, more preferably in the range of 5 to 40 nm, even more preferably in the range of 2 to 39 nm. If the average primary particle diameter of the abrasive grains is less than 2 nm, the polishing rate of an interlayer dielectric layer tends to be declined. On the other hand, if the average primary particle diameter of the abrasive grains is more than 100 nm, scratches tends to increase.

The method for measuring the average secondary particle diameter is not particularly limited, and may be any existing average-secondary-particle-diameter measuring method. The diameter can be measured with, in particular, a submicron particle analyzer based on the dynamic scattering method. The method for measuring the average primary particle diameter is not particularly limited, and may be any existing average-primary-particle-diameter measuring method. The method is, for example, a method of making an actual measurement in a TEM or SEM photograph, and may be a method of measuring the BET specific surface area, and then converting it into the diameter (the specific surface area converting method).

In the invention, the "average secondary particle diameter" is the average particle diameter of a material made of secondary particles formed by the aggregation of primary particles. The "average primary particle diameter" is the average particle diameter of primary particles. Colloidal silica, which is preferred as the abrasive grains, may be yielded by a known production process based on the hydrolysis of a silicon alkoxide or ion exchange of sodium silicate. Colloidal silica yielded by the production process based on the hydrolysis of a silicon alkoxide is most preferably used from the viewpoint of particle diameter controllability and alkali metal impurities. The silicon alkoxide may be generally TEMS (tetramethoxysilane) or TEOS (tetraethoxysilane). In a method of hydrolyzing the alkoxide in an alcohol solvent, examples of parameters which affect the particle diameter include the concentration of the silicon alkoxide, the concentration of ammonia used as a catalyst, and the pH, the reaction temperature, the kind (molecular weight) of the alcohol solvent, and the reaction time. By adjusting these parameters, a colloidal silica dispersed slurry having a desired particle diameter and aggregation degree can be obtained. Colloidal alumina may be yielded by a known production process based on the hydrolysis of aluminum nitrate.

The metal-oxide-dissolving agent used in the invention is not particularly limited, and examples thereof include organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhaxanoic acid, benzoic acid, glycolic acid, salicylic acid, glyceric acid, oxalic acid, malonic acid, succinic acid, glutaric acid, adipic acid, pimelic acid, malic acid, phthalic acid, malic acid, tartaric acid, and citric acid; and organic-acid esters thereof. Particularly preferred is a metal-oxide-dissolving agent containing no amino group. If a metal-oxide-dissolving agent contains an amino group, the pH may turn into a neutral range, so that the possibility that the pH is not easily adjusted into a low value is high. If the pH is in a neutral range, a sufficient polishing rate of a metal or metals (a metal barrier layer and/or an electroconductive material layer) may not be obtained. The metal-oxide-dissolving agent used in the invention may be an ammonium salt of any one of the organic acids, and may be an inorganic acid such as hydrochloric acid, sulfuric acid or nitric acid, any ammonium salts of the inorganic acids, such as ammonium persulfate, ammonium nitrate or ammonium chloride, or ammonium chromate. Of these agents, preferred are organic acids such as formic acid, malonic acid, malic acid, tartaric acid and citric acid since a practical CMP rate is maintained while the etching rate can be effectively restrained. These organic acids are more preferably used for an electroconductive material layer containing at least one selected from copper, copper alloys, copper oxides, and copper alloy oxides. These may be used alone or in the form of a mixture of two or more thereof.

The pH of the metal polishing slurry of the invention is not particularly limited, and is preferably in the range of 2 to 5, more preferably in the range of 2 to 4. If the pH is less than 2, the corrosion of a metal in an electroconductive material layer may advance so that the wiring resistance may deteriorate. If the pH is more than 5, the polishing rate of an electroconductive material layer may not be sufficiently obtained.

The metal polishing slurry of the invention may contain a metal oxidizing agent. The metal oxidizing agent is not particularly limited, and examples thereof include hydrogen peroxide ($H_2O_2$), nitric acid, potassium periodate, hypochlorous acid, and ozone water. Of these agents, particularly preferred is hydrogen peroxide. These may be used alone or in the form of a mixture of two or more thereof.

When a substrate to which the metal polishing slurry of the invention is applied is a silicon substrate containing integrated circuit elements, it is undesired that the substrate is contaminated with an alkali metal, an alkaline earth metal, a halide or the like. Therefore, the oxidizing agent is desirably an oxidizing agent containing no nonvolatile component. However, ozone water is heavily changed in composition with the passage of time; thus, hydrogen peroxide is most preferred. However, when the substrate to which the slurry is applied is a glass substrate containing no semiconductor element, or the like, an oxidizing agent containing a nonvolatile component may be used.

The metal polishing slurry of the invention may contain a metal anticorrosive agent. The metal anticorrosive agent is not particularly limited, and is, for example, a compound having a triazole skeleton, a compound having a pyrazole skeleton, a compound having a pyrimidine skeleton, a compound having an imidazole skeleton, a compound having a guanidine skeleton, a compound having a thiazole skeleton, or the like.

Examples of the compound having a triazole skeleton include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzo]triazolyl-1-methyl][1,2,4-triazolyl-1-methyl][2-ethylhexyl]amine, tolyltriazole, naphthotriazole, bis[(1-benzotriazolyl)methyl] phosphonic acid, and the like.

Examples of the compound having a pyrazole skeleton include 3,5-dimethylpyrazole, 3-methyl-5-pyrazolone, 3-amino-5-methylpyrazole, 3-amino-5-hydroxypyrazole, 3-amino-5-methylpyrazole, and the like.

Examples of the compound having a pyrimidine skeleton include pyrimidine,1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydropyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetoamidepyrimidine, 2-aminopyrimidine, 2-methyl-5,7-diphenyl-(1,2,4)triazolo(1,5-a)pyrimidine, 2-methylsulfanylyl-5,7-diphenyl-(1,2,4)triazolo(1,5-a)pyrimidine, 2-methylsulfanylyl-5,7-diphenyl-4,7-dihydro-(1,2,4)triazolo(1,5-a) pyrimidine, 4-aminopyrazolo[3,4-d]pyrimidine, and the like.

Examples of the compound having an imidazole skeleton include imidazole, 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-aminoimidazole, mercaptobenzoimidazole, and the like.

Examples of the compound having a guanidine skeleton include 1,3-diphenylguanidine, 1-methyl-3-nitroguanidine, and the like.

Examples of the compound having a thiazole skeleton include 2-aminothiazole, 4,5-dimethylthiazole, 2-amino-2-thiazoline, 2,4-dimethylthiazole, 2-amino-4-methylthiazole, and the like.

Of these compounds, the compound having a triazole skeleton is preferred, and benzotriazole is particularly preferred. These metal anticorrosive agents may be used alone or in the form of a mixture of two or more thereof.

The metal polishing slurry of the invention may contain an organic solvent. The organic solvent is not particularly limited, and examples thereof include carbonate compounds such as ethylene carbonate, propylene carbonate, dimethyl carbonate, diethyl carbonate, and methylethyl carbonate; lactone compounds such as butyrolactone and propiolactone; glycol compounds such as ethylene glycol, propylene glycol, diethylene glycol, dipropylene glycol, triethylene glycol, and tripropylene glycol; glycol ether compounds such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, tripropylene glycol monobutyl ether, ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, tripropylene glycol dibutyl ether, tetrahydrofuran, dioxane, dimethoxyethane, polyethylene oxide, ethylene glycol monomethyl acetate, diethylene glycol monoethyl ether acetate, and propylene glycol monomethyl ether acetate; alcohol compounds such as methanol, ethanol, propanol, n-butanol, n-pentanol, n-hexanol, and isopropanol; ketone compounds such as acetone, and methyl ethyl ketone; and other solvents such as phenol, dimethylformamide, n-methylpyrrolidone, ethyl acetate, ethyl lactate, and sulfolane.

The metal polishing slurry of the invention may contain a polymer having a weight-average molecular weight of 500 or more. The weight-average molecular weight is more preferably 1500 or more, in particular preferably 5000 or more. The upper limit of the weight-average molecular weight is not particularly limited, and is 5000000 or less from the viewpoint of solubility. If the weight-average molecular weight is less than 500, an excessively high metal-protecting effect is produced so that a high polishing rate for a metal barrier layer tends not to be expressed. In the invention, it is preferred to use at least one water-soluble polymer having a weight-average molecular weight of 500 or more. The polymer, which has a weight-average molecular weight of 500 or more, is not particularly limited, and examples thereof include polysaccharides such as alginic acid, pectic acid, carboxymethylcellulose, agar, curdlan, and pullulan; polycarboxylic acids and salts thereof, such as polyaspartic acid, polyglutamic acid, polylysine, polymalic acid, polymethacrylic acid, ammonium polymethacrylate, sodium polymethacrylate, polyamic acid, polymaleic acid, polyitaconic acid, polyfumaric acid, poly(p-styrenecarboxylic acid), polyacrylic acid, polyacrylamide, aminopolyacrylamide, ammonium polyacrylate, sodium polyacrylate, polyamic acid, a polyamic acid ammonium salt, a polyamic acid sodium salt, and polyglyoxylic acid; and vinyl polymers such as polyvinyl alcohol, polyvinyl pyrrolidone, and polyacrolein. These may be used alone or in the form of a mixture of two or more thereof.

However, when a substrate to which the metal polishing slurry of the invention is applied is a silicon substrate for semiconductor integrated circuits, or the like, it is undesired that the substrate is contaminated with an alkali metal, an alkaline earth metal, a halide or the like. Therefore, the polymer is preferably a polymer which neither contains an alkali metal, an alkaline earth metal nor a halide. The polymer is in particular preferably pectic acid, agar, polymalic acid, polymethacrylic acid, polyacrylic acid, ammonium polyacrylate, polyacrylamide, polyvinyl alcohol or polyvinyl pyrrolidone; any ester or ammonium salt thereof; or the like. However, when the substrate is a glass substrate or the like, the matter is not applicable.

The weight-average molecular weight of the polymer can be measured by use of a calibration curve of standard polystyrene according to gel permeation chromatography.

The blend amount of the abrasive grains used in the invention is preferably from 0.001 to 50 parts by mass, more preferably from 0.01 to 45 parts by mass, in particular preferably from 0.1 to 40 parts by mass for 100 parts by mass of the abrasive grains, the metal-oxide-dissolving agent, and water. If the blend amount of the abrasive grains is less than 0.001 part by mass, the polishing rate of a blanket substrate on which a silicon-coating film or organic polymer used as an interlayer dielectric layer is formed tends to be small. If the blend amount of the abrasive grains is more than 50 parts by mass, many scratches tends to be generated.

The blend amount of the metal-oxide-dissolving agent used in the invention is preferably from 0.001 to 20 parts by mass, more preferably from 0.002 to 15 parts by mass, in particular preferably from 0.005 to 15 parts by mass for 100 parts by mass of the abrasive grains, the metal-oxide-dissolving agent, and water. If the blend amount of the metal-oxide-dissolving agent is less than 0.001 part by mass, the polishing rate of an electroconductive material layer tends to be declined. If the blend amount is more than 20 parts by mass, etching is not easily restrained so that the polished surface tends to become rough.

The blend amount of the metal oxidizing agent used in the invention is preferably from 0 to 50 parts by mass, more preferably from 0.001 to 45 parts by mass, in particular preferably from 0.002 to 40 parts by mass for 100 parts by mass of the abrasive grains, the metal-oxide-dissolving agent, and water. If the blend amount of the metal oxidizing agent is more than 50 parts by mass, the polished surface tends to become rough.

The blend amount of the metal anticorrosive agent used in the invention is preferably from 0 to 10 parts by mass, more preferably from 0.001 to 8 parts by mass, in particular preferably from 0.002 to 5 parts by mass for 100 parts by mass of the abrasive grains, the metal-oxide-dissolving agent, and water. If the blend amount of the metal anticorrosive agent is more than 10 parts by mass, the polishing rate of an electroconductive material layer tends to be declined.

The blend amount of the organic solvent used in the invention is preferably from 0 to 95 parts by mass, more preferably from 0.2 to 60 parts by mass, in particular preferably from 0.5 to 50 parts by mass for 100 parts by mass of the abrasive grains, the metal-oxide-dissolving agent, and water. If the blend amount of the organic solvent is more than 95 parts by mass, the probability of ignition is generated. Thus, the amount is not preferred for the process of the production.

The blend amount of the polymer used in the invention, which has a weight-average molecular weight of 500 or more, is preferably from 0 to 10 parts by mass, more preferably from 0.01 to 8 parts by mass, in particular preferably from 0.02 to 5 parts by mass for 100 parts by mass of the abrasive grains, the metal-oxide-dissolving agent, and water. If the blend amount of the polymer is more than 10 parts by mass, the polishing rate of each of an electroconductive material layer, a metal barrier layer and an interlayer dielectric layer tends to be declined.

The metal polishing slurry of the invention may contain a surfactant, a dye such as Victoria Pure Blue, a pigment such as phthalocyanine green, or any other colorant as well as the materials.

A polishing-receiving film to be polished with the metal polishing slurry of the invention is a polishing-receiving film containing two or more selected from an electroconductive material layer, a metal barrier layer, and an interlayer dielectric layer, and is, for example, a polishing-receiving film containing an electroconductive material layer and a metal barrier layer, a polishing-receiving film containing an electroconductive material layer and an interlayer dielectric layer, a polishing-receiving film containing a metal barrier layer and an interlayer dielectric layer, and a polishing-receiving film containing an electroconductive material layer, a metal barrier layer, and an interlayer dielectric layer.

The metal polishing slurry of the invention is used in the second CMP polishing step, which is for a patterned substrate after the first CMP polishing step. Specifically, as illustrated in FIG. 1, the metal polishing slurry of the invention is applied to a desired pattern substrate (FIG. 1(b)) obtained by: preparing a substrate (FIG. 1(a)) having an interlayer dielectric layer 3 having a surface composed of concave and convex regions, a metal barrier layer 2 which covers the interlayer dielectric layer 3 along its surface, and an electroconductive material layer 1 which is filled into the concave regions to cover the metal barrier layer 2; and polishing the electroconductive material layer 1 through the first CMP polishing step, thereby making the metal barrier layer 2 on the convex regions naked, and causing the electroconductive material layer 1 in the concave regions to remain. As the polishing slurry used in the first CMP polishing step, a polishing slurry usually used in the first CMP polishing step, such as an alumina based polishing slurry or a silica based polishing slurry may be used.

The metal polishing slurry of the invention is used to polish the metal barrier layer 2 of the patterned substrate in FIG. 1(b), and then continuously polish the interlayer dielectric layer 3, the metal barrier layer 2 and the electroconductive material layer 1 in such a manner that the patterned substrate (FIG. 1(c1)) having a dishing 4 generated in the electroconductive material 1 is cancelled, whereby the patterned substrate can be planarized (FIG. 1(c2)). In order to stop the polishing of the interlayer dielectric layer so as to avoid any dishing, it is advisable to adjust the polishing rate ratio while adjusting the polishing period appropriately. About the polishing period, for example, the polishing rate for a blanket wafer or the like is beforehand calculated and the period when the interlayer dielectric layer is polished up to a depth of about 500 to 1000 Å is measured. On the basis of the period, the polishing period is adjusted.

Examples of the electroconductive material layer include copper, any copper alloy, any copper oxide, any copper alloy oxide, tungsten, any tungsten alloy, silver, and gold. Of these materials, preferred are copper, any copper alloy, any copper oxide, any copper alloy oxide, and so on. The electroconductive material layer may be a film obtained by forming the materials into a film form by known sputtering or plating.

The metal barrier layer is formed to prevent the electroconductive material from diffusing into the interlayer dielectric layer and improve the adhesion between the interlayer dielectric layer and the electroconductive material. The composition of the metal barrier layer is preferably selected from tungsten, and tungsten compounds such as tungsten nitride and tungsten alloy; titanium, and titanium compounds such as titanium nitride and titanium alloy; tantalum, and tantalum compounds such as tantalum nitride and tantalum alloy; ruthenium, and ruthenium compounds such ruthenium alloy; alloy made of copper and manganese, and alloy made of copper, manganese and silicon oxide; and others. The barrier layer may have a monolayer made of any one of these materials, or a laminated structure made of two or more thereof.

The interlayer dielectric layer is, for example, a silicon-coating film or an organic polymer film. The silicon-coating film is, a silica-coating film containing, for example, silicon dioxide, fluorosilicate glass, organosilicate glass obtained from trimethylsilane or dimethoxydimethylsilane as a starting material, silicon oxynitride, hydrogenated silsesquioxane, silicon carbide, or silicon nitride. The organic polymer film may be a fully aromatic low-dielectric-constant interlayer dielectric layer. Of these examples, organic silicate glass is preferred.

These films may each be formed by CVD, spin coating, dip coating or spraying. A specific example of the interlayer dielectric layer is an interlayer dielectric layer in an LSI-producing process, in particular, in a multilayer interconnection forming step therein.

The polishing method of the invention is a method comprising the step of polishing a polishing-receiving film while supplying the metal polishing slurry of the present invention onto a polishing cloth of a polishing table by moving the polishing table and a substrate having the polishing-receiving film relatively to each other in the state that the substrate is pushed and pressed onto the polishing cloth.

The machine for the polishing may be an ordinary polishing machine having a holder for holding a substrate, and a table to which a polishing cloth is attached (and to which a motor giving a variable rotation speed, and so on are fitted). The polishing cloth may be an ordinary nonwoven cloth, a foamed polyurethane, a porous fluorine-contained resin or the like, and is not particularly limited.

Conditions for the polishing are not particularly limited, and the rotational speed of the table is preferably as low as 200 rpm or less so as for the substrate not to be spun out. The pushing pressure of the substrate having a polishing-receiving film, onto the polishing cloth is preferably from 1 to 100 kPa. The pressure is more preferably from 5 to 50 kPa in order that polishing-rate-evenness in the polishing-receiving plane and pattern-smoothness can be satisfied. During the polishing, the metal polishing slurry of the invention is continuously supplied to the polishing cloth through a pump or the like. The supply amount thereof is not particularly limited, and is preferably an amount permitting the polishing cloth surface to be covered with the metal polishing slurry. After the polishing, it is preferred to wash the substrate sufficiently with flowing water, use a spin drier or the like to drop water droplets adhering onto the substrate, and then dry the substrate.

A purpose of the invention is to polish the electroconductive material layer 1 (for example, a copper layer) illustrated in FIG. 1(a) until the metal barrier layer 2 is made naked, so as to turn the workpiece into a state illustrated in FIG. 1(b) (first CMP polishing step), and then cancel the resultant dishing in the next step of polishing the metal barrier layer 2 (second CMP polishing step). As a polishing slurry used in the first CMP polishing step for polishing the electroconductive material layer 1, which is to be wiring metal such as copper, various slurries have been suggested hitherto. In recent years, polishing slurries for decreasing the amount of dishing have been suggested; however, it is substantially impossible that dishing is completely prevented. In other words, as illustrated in FIG. 1(b), excessive polishing of copper is more or less generated even when the used polishing slurry is selected from all slurries and polishing conditions are set into any variation. As a result, the dishing 4 is unfavorably generated.

The metal polishing slurry of the invention makes it possible to improve the dishing in the second CMP polishing step. The metal polishing slurry of the invention is used to apply the second CMP polishing step to the patterned substrate in FIG. 1(b), thereby polishing the metal barrier layer in any region other than the groove regions so as to yield the patterned substrate having the dishing 4 generated in the first CMP polishing step (FIG. 1(c1)) once in the polishing process. Subsequently, the patterned substrate is polished, whereby a patterned substrate as illustrated in FIG. 1(c2), which has a planarized surface, can be yielded. In order to polish the patterned substrate into such a state, it is important to adjust the ratio between the polishing rate of the electroconductive material layer (copper film) and that of the interlayer dielectric layer.

That is, it is important that the polishing rate of the electroconductive material layer is lower than that of the interlayer dielectric layer in order to cancel the dishing. About the ratio to be selected, the ratio of the polishing rate of the electroconductive material to that of the interlayer dielectric layer is preferably 0.72 or less, and is in particular preferably from 0.35 to 0.70.

In order to adjust the polishing rate of the electroconductive material layer (for example, a copper film) in the invention, a method of adjusting the rate in accordance with the amount of an oxidizing agent (for example, hydrogen peroxide) is given. Specifically, for example, the polishing rate of the electroconductive material layer (copper film) becomes larger as the amount of the oxidizing agent to be added is made larger. In a more specific example, the removal of the copper film is about 300 Å/minute when the amount of a 30% solution of hydrogen peroxide in water is about 1%. As the amount of the oxidizing agent becomes larger, the polishing rate of the metal barrier layer also becomes larger.

In the meantime, the polishing rate of the interlayer dielectric layer can be adjusted by adjusting the particle diameter of the abrasive grains or the blend amount of the abrasive grains. Specifically, as the particle diameter is larger, the polishing rate tends to become higher. As the blend amount of the abrasive grains is larger, the polishing rate tends to become larger. In order to polish a silicon-coating film or organic polymer film at a high velocity, preferred is a method of blending an organic solvent to make the wettability high. In order to restrain the polishing rate of a silicon-coating film or organic polymer film, effective is a method of blending no organic solvent or making the blend amount of an organic solvent small.

In order for the metal polishing slurry to give/have the polishing rate ratio and polishing characteristics as described above out of the structural requirements described above, it is preferred to satisfy any one of the following requirements: two or more abrasive grain species different from each other in average secondary particle diameter are incorporated into a polishing slurry, and further the pH of the polishing slurry is set into the range of 2 to 5; the metal-oxide-dissolving agent is appropriately selected (specifically, preferred is a metal-oxide-dissolving agent containing no amino group, in particular, formic acid, malonic acid, malic acid, tartaric acid or citric acid); and the slurry contains an oxidizing agent. Alternatively, it is more preferred that two or more abrasive grain species different from each other in average secondary particle diameter are incorporated into a polishing slurry, and further two or more of the requirements are combined with each other.

EXAMPLES

The invention will be described by way of examples hereinafter. However, the invention is not limited by these examples.

Examples 1 to 8, and Comparative Examples 1 to 2

(Polishing Slurry Producing Method)
Some materials shown in Table 1 were mixed with each other in individual amounts (parts by mass) to prepare each of metal polishing slurries used in Examples 1 to 8 and Comparative Examples 1 to 2. The metal polishing slurry was used to polish each of substrates yielded described below under polishing conditions described below.
(Method for Measuring the Average Secondary Particle Diameter)
The average secondary particle diameter of abrasive grains was measured with a submicro particle analyzer (machine name: N5 Submicron Particle Size Analyzer, manufactured by Beckman Coulter, Inc.) based on the dynamic scattering method.
(Method for Measuring Average Primary Particle Diameter)
About the average primary particle diameter of abrasive grains, an ultra high resolving-power electron microscope (SEM) (machine name: Hitachi S-4800, manufactured by Hitachi Kyowa Engineering Co., Ltd.) was used to take a photograph thereof, and then the size was actually measured.
(Substrates)
Substrates described below were prepared.
(A) Blanket Substrates:
Blanket substrates (a1): trimethylsilane was used as a starting material to form organosilicate glass film (thickness: 1000 nm) on a silicon substrate by CVD.
Blanket substrates (a2): silicon dioxide of 1000 nm thickness was formed on a silicon substrate.
Blanket substrates (a3): tantalum of 200 nm thickness was formed on a silicon substrate.
Blanket substrates (a4): copper of 1600 nm thickness was formed on a silicon substrate.
(B) Patterned Substrates:
Patterned substrates (b1): trimethylsilane was used as a starting material to form organosilicate glass film as an interlayer dielectric layer on a silicon substrate by CVD. A known method was used to make grooves (concaves) of 0.5 μm depth in the organosilicate glass. On the surface thereof, a tantalum film of 200 nm thickness was formed as a metal barrier layer along the surface by sputtering. A copper film of 1.0 μm thickness was formed as an electroconductive material layer on the tantalum film by sputtering, so as to be embedded into the grooves. A silica based polishing slurry (product name: HS-0500-10, manufactured by Hitachi Chemical Co., Ltd.) was used to polish only projected portions of the copper film in a first CMP step to make concave portions of the barrier layer naked into the polished surface. In this way, patterned substrates (b1) were each yielded.
Patterned substrates (b2): the same operations as descried above were made except that instead of the organosilicate glass, silicon dioxide was used as the interlayer dielectric layer. In this way, patterned substrates (b2) were each yielded.

(Polishing Conditions)

Polishing pad: a foamed polyurethane resin (model number: IC1000, manufactured by Rodale Co.)

Polishing pressure: 140 kg/cm² (13.73 kPa)

Rotation speed of the polishing table and the wafer holder: 90 rpm

Supply amount of each of the polishing slurries: 150 mL/min.

(Evaluation Items)

(1) Polishing rates: each of the metal polishing slurries was used to polish the individual blanket substrates (a1) to (a4) for 60 seconds. The polishing rate of the organosilicate glass and that of the silicon dioxide were each obtained by measuring the difference between the film thickness before the polishing and that after the polishing with a film thickness tester (product name: RAMDA ACE manufactured by Dainippon Screen Mfg. Co., Ltd. The polishing rate of the tantalum and that of the copper were each obtained by calculating the difference between the film thickness before the polishing and that after the polishing by conversion from the electric resistance values.

(2) Flatness (dishing amount): each of the metal polishing slurries was used to polish the individual patterned substrates (b1) to (b2) for 90 seconds. A stylus surface profilometer was used to measure the surface form of a stripe-form pattered region formed in each of the patterned substrates, wherein wiring metal regions each having a width of 100 φm and dielectric layer regions each having a width of 100 μm were alternately arranged. The amount of the film reduction from interlayer dielectric layer regions to the wiring metal regions was measured. This was used as an index of the flatness.

(3) Flatness (erosion amount): each of the metal polishing slurries was used to polish the individual patterned substrates (b1) to (b2) for 90 seconds. The stylus surface profilometer was used to measure the surface form of a stripe-form pattered region having a total width of 2.5 mm and formed in each of the patterned substrates, wherein wiring metal regions each having a width of 4.5 μm and dielectric layer regions each having a width of 0.5 μm were alternately arranged. The amount of the film reduction of the interlayer dielectric layer regions near the center of the pattern to the interlayer dielectric layer regions in the periphery of the stripe-form patterned region was measured. This was used as an index of the flatness.

The metal polishing slurries of Examples 1 to 8 and Comparative Examples 1 to 2 were used to make the evaluations. The results are shown in Tables 1 and 2.

TABLE 1

| | | Example | | | | |
| --- | --- | --- | --- | --- | --- | --- |
| | | 1 | 2 | 3 | 4 | 5 |
| Abrasive grains | Colloidal silica A | 2 | 0 | 0 | 0 | 0 |
| | Colloidal silica B | 0 | 2 | 2.5 | 3 | 0 |
| | Colloidal silica C | 0 | 0 | 0 | 0 | 2 |
| | Colloidal silica D | 3 | 6 | 0 | 9 | 0 |
| | Colloidal silica E | 0 | 0 | 4.5 | 0 | 4 |
| | Average secondary particle diameter of the whole of abrasive grains | 69 | 70 | 91 | 71 | 90 |
| Metal-oxide-dissolving agent | Malonic acid | 0.5 | 0 | 0.5 | 0 | 0.5 |
| | Malic acid | 0 | 0.5 | 0 | 0.5 | 0 |
| Oxidizing agent | Hydrogen peroxide | 1 | 1 | 1 | 1 | 1 |
| Metal anticorrosive agent | Benzotriazole | 0.1 | 0.1 | 0.1 | 0.1 | 0.1 |
| | Triazole | 0 | 0 | 0 | 0 | 0 |
| Organic solvent | Isopropyl alcohol | 0 | 6 | 0 | 0 | 0 |
| | Propylene glycol monomethyl eter | 5 | 0 | 0 | 5 | 0 |
| | Propylene glycol monopropyl eter | 0 | 0 | 7 | 0 | 0 |
| Polymer | Polyacrylic acid (weight-average molecular weight: 25000) | 0.05 | 0 | 0 | 0.05 | 0 |
| Water | | 90 | 90 | 90 | 90 | 90 |
| pH of metal polishing slurry | | 3 | 3 | 3 | 3 | 3 |
| Polishing rate (Å/min.) | Blanket substrate (a1) | 520 | 590 | 480 | 610 | 410 |
| | Blanket substrate (a2) | 610 | 680 | 620 | 750 | 640 |
| | Blanket substrate (a3) | 500 | 480 | 470 | 620 | 610 |
| | Blanket substrate (a4) | 310 | 290 | 320 | 310 | 280 |
| Dishing amount (Å) | Patterned substrate (b1) | 600 | 550 | 610 | 570 | 800 |
| | Patterned substrate (b2) | 550 | 500 | 550 | 450 | 540 |
| Erosion amount (Å) | Patterned substrate (b1) | 590 | 560 | 600 | 550 | 800 |
| | Patterned substrate (b2) | 540 | 490 | 560 | 440 | 560 |

The particle diameters of the colloidal silicas A to E shown in Tables 1 and 2 are as follows:

Colloidal silica A: average secondary particle diameter: 22 nm, and average primary particle diameter: 11 nm Colloidal silica B: average secondary particle diameter: 28 nm, and average primary particle diameter: 13 nm Colloidal silica C: average secondary particle diameter: 50 nm, and average primary particle diameter: 26 nm Colloidal silica D: average secondary particle diameter: 70 nm, and average primary particle diameter: 43 nm Colloidal silica E: average secondary particle diameter: 90 nm, and average primary particle diameter: 50 nm

TABLE 2

|  |  | Example | | | Comparative Example | |
| --- | --- | --- | --- | --- | --- | --- |
|  |  | 6 | 7 | 8 | 1 | 2 |
| Abrasive grains | Colloidal silica A | 3 | 0 | 0 | 0 | 6 |
|  | Colloidal silica B | 0 | 1 | 2 | 0 | 0 |
|  | Colloidal silica C | 0 | 5 | 0 | 0 | 0 |
|  | Colloidal silica D | 6 | 0 | 6 | 6 | 0 |
|  | Colloidal silica E | 0 | 0 | 0 | 0 | 0 |
|  | Average secondary particle diameter of the whole of abrasive grains | 68 | 50 | 72 | 71 | 22 |
| Metal-oxide-dissolving agent | Malonic acid | 0.5 | 0 | 0.5 | 0.5 | 0 |
|  | Malic acid | 0 | 0.5 | 0 | 0 | 0.5 |
| Oxidizing agent | Hydrogen peroxide | 1 | 1 | 1 | 1 | 1 |
| Metal anticorrosive agent | Benzotriazole | 0.1 | 0.1 | 0.1 | 0.1 | 0.1 |
|  | Triazole | 0.1 | 0 | 0 | 0 | 0 |
| Organic solvent | Isopropyl alcohol | 0 | 6 | 0 | 0 | 6 |
|  | Propylene glycol monomethyl eter | 5 | 0 | 0 | 5 | 0 |
|  | Propylene glycol monopropyl eter | 0 | 0 | 0 | 0 | 0 |
| Polymer | Polyacrylic acid (weight-average molecular weight: 25000) | 0 | 0.05 | 0 | 0.05 | 0 |
| Water |  | 90 | 90 | 90 | 100 | 100 |
| pH of metal polishing slurry |  | 3 | 3 | 3 | 3 | 3 |
| Polishing rate (Å/min.) | Blanket substrate (a1) | 600 | 530 | 420 | 300 | 310 |
|  | Blanket substrate (a2) | 690 | 590 | 690 | 410 | 390 |
|  | Blanket substrate (a3) | 550 | 600 | 570 | 430 | 500 |
|  | Blanket substrate (a4) | 310 | 300 | 270 | 310 | 300 |
| Dishing amount (Å) | Patterned substrate (b1) | 540 | 590 | 750 | 1050 | 1200 |
|  | Patterned substrate (b2) | 490 | 560 | 520 | 1050 | 1050 |
| Erosion amount (Å) | Patterned substrate (b1) | 530 | 600 | 780 | 1100 | 1190 |
|  | Patterned substrate (b2) | 510 | 550 | 500 | 1010 | 1350 |

In Comparative Examples 1 and 2, the dishing amount and the erosion amount are large since the polishing rate thereof is small for the blanket substrate (a1) or (a2) on which the organosilicate glass or silicon dioxide, which is an interlayer dielectric layer, is formed. On the other hand, in Examples 1 to 8, the polishing rate thereof is large for the blanket substrate (a1) or (a2) on which the organosilicate glass or silicon dioxide, which is an interlayer dielectric layer, is formed. Thus, the dishing amount and the erosion amount are small. It has been understood that a metal polishing slurry as found out in Examples is excellent in being made finer and thinner and in dimension precision and in electric characteristics, is high in reliability, and can attain a decrease in costs.

INDUSTRIAL APPLICABILITY

According to the invention, a metal polishing slurry can be obtained which gives a large polishing rate of an interlayer dielectric layer, and is high in the flatness of the polished surface. This metal polishing slurry is suitable for a semiconductor device which is excellent in being made finer and thinner and in dimension precision and in electric characteristics, is high in reliability, and can attain a decrease in costs.

According to the invention, a metal polishing slurry can be obtained which can keep the polishing rate of an interlayer dielectric layer without lowering the polishing rate of a metal barrier layer, so as to give a high flatness of polished surfaces and exhibit a good productivity as well as the advantageous effect of the invention is produced.

According to the invention, a metal polishing slurry can be obtained which is excellent in washability after polishing, so as to give a high flatness of a polished surface and exhibit a good productivity as well as the advantageous effects of the invention are produced.

According to the invention, a metal polishing slurry can be obtained which makes the polishing rate of a metal barrier layer and that of an interlayer dielectric layer high, so as to give a high flatness of polished surfaces and exhibit a good productivity as well as the advantageous effects of the invention are produced.

According to the invention, a metal polishing slurry can be obtained which causes the generation of scratches to be restrained as well as the advantageous effects of the invention are produced.

According to the invention, a metal polishing slurry can be obtained which makes it possible to adjust the polishing rate of an electroconductive material layer made of copper, copper alloy or the like as well as the advantageous effects of the invention are produced.

According to the invention, a metal polishing slurry can be obtained which makes it possible to adjust the polishing rate of an electroconductive material layer made of copper, copper alloy or the like and remove residues of the electroconductive material such as copper as well as the advantageous effects of the invention are produced.

According to the invention, a metal polishing slurry can be obtained which is excellent in the polish-evenness of an electroconductive material layer made of copper, copper alloy or the like, a metal barrier layer and an interlayer dielectric layer as well as the advantageous effects of the invention are produced.

According to the invention, a metal polishing slurry which has the advantageous effects of the invention can be obtained for an electroconductive material layer made of copper, copper alloy or the like.

According to the invention, a metal polishing slurry which has the advantageous effects of the invention can be obtained for a metal barrier layer selected from tantalum, tantalum compounds, titanium, titanium compounds, tungsten and tungsten compounds.

According to the invention, a polishing method can be obtained for the production of a semiconductor device which is excellent in being made finer and thinner and in dimension precision and in electric characteristics, is high in reliability, and can attain a decrease in costs.

The invention claimed is:

1. A metal polishing slurry containing abrasive grains, a metal-oxide-dissolving agent, a metal oxidizing agent, a metal anticorrosive agent, an organic solvent, and water,
    wherein the abrasive grains are colloidal silica and contain
        1 to 50% by mass of first abrasive grains having an average secondary particle diameter being in the range of 5 to 39 nm and
        50 to 99% by mass of second abrasive grains having an average secondary particle diameter being in the range of 40 to 150 nm,
    the metal-oxide-dissolving agent is at least one selected from organic acids, organic-acid esters, ammonium salts of organic acids, and inorganic acids,
    the metal oxidizing agent is at least one selected from hydrogen peroxide, nitric acid, potassium periodate, hypochlorous acid, and ozone water,
    the metal anticorrosive agent is at least one selected from a compound having a triazole skeleton, a compound having a pyrazole skeleton, a compound having a pyrimidine skeleton, a compound having an imidazole skeleton, a compound having a guanidine skeleton, and a compound having a thiazole skeleton,
    and a pH is in the range of 2 to 4, and
    wherein the abrasive grains consist of the colloidal silica.

2. The metal polishing slurry according to claim 1, wherein the average secondary particle diameter of the abrasive grains is in the range of 1 to 1000 nm.

3. The metal polishing slurry according to claim 1, wherein the abrasive grains contain abrasive grains having an average primary particle diameter being in the range of 2 to 100 nm.

4. The metal polishing slurry according to claim 1, wherein the organic solvent is at least one selected from glycol ether compounds, alcohol compounds, and carbonate compounds.

5. The metal polishing slurry according to claim 1, which further comprises a polymer having a weight-average molecular weight of 500 or more.

6. The metal polishing slurry according to claim 1, wherein a polishing-receiving film to be polished with the metal polishing slurry is a polishing-receiving film containing an electroconductive material layer and a metal barrier layer.

7. The metal polishing slurry according to claim 1, wherein a polishing-receiving film to be polished with the metal polishing slurry is a polishing-receiving film containing an electroconductive material layer and an interlayer dielectric layer.

8. The metal polishing slurry according to claim 1, wherein a polishing-receiving film to be polished with the metal polishing slurry is a polishing-receiving film containing a metal barrier layer and an interlayer dielectric layer.

9. The metal polishing slurry according to claim 1, wherein a polishing-receiving film to be polished with the metal polishing slurry is a polishing-receiving film containing an electroconductive material layer, a metal barrier layer and an interlayer dielectric layer.

10. The metal polishing slurry according to claim 6, wherein the electroconductive material layer is a layer comprising at least one selected from copper, copper alloys, copper oxides, and copper alloy oxides.

11. The metal polishing slurry according to claim 6, wherein the metal barrier layer is a single layer or a lamination made of two or more layers, and the layer(s) (each) comprise(s) at least one selected from tantalum, tantalum compounds, titanium, titanium compounds, tungsten, tungsten compounds, ruthenium, ruthenium compounds, copper-manganese alloys, and copper-manganese-silicon oxide alloys.

12. The metal polishing slurry according to claim 7, wherein the interlayer dielectric layer is a silicon-coating film or an organic polymer film.

13. The metal polishing slurry according to claim 1, wherein the amount of the abrasive grains is from 0.001 to 50 parts by mass, based on 100 parts by mass of the whole of the metal polishing slurry.

14. The metal polishing slurry according to claim 7, wherein the ratio between the polishing rate of the electroconductive material layer and that of the interlayer dielectric layer is 0.72 or less.

15. A polishing method, comprising the step of polishing a polishing-receiving film while supplying the metal polishing slurry according to claim 1, onto a polishing cloth of a polishing table by moving the polishing table and a substrate having the polishing-receiving film relatively to each other in the state that the substrate is pushed and pressed onto the polishing cloth.

16. The metal polishing slurry according to claim 7, wherein the electroconductive material layer is a layer comprising at least one selected from copper, copper alloys, copper oxides, and copper alloy oxides.

17. The metal polishing slurry according to claim 9, wherein the electroconductive material layer is a layer comprising at least one selected from copper, copper alloys, copper oxides, and copper alloy oxides.

18. The metal polishing slurry according to claim 8, wherein the metal barrier layer is a single layer or a lamination made of two or more layers, and the layer(s) (each) comprise(s) at least one selected from tantalum, tantalum compounds, titanium, titanium compounds, tungsten, tungsten compounds, ruthenium, ruthenium compounds, copper-manganese alloys, and copper-manganese-silicon oxide alloys.

19. The metal polishing slurry according to claim 9, wherein the metal barrier layer is a single layer or a lamination made of two or more layers, and the layer(s) (each) comprise(s) at least one selected from tantalum, tantalum compounds, titanium, titanium compounds, tungsten, tungsten compounds, ruthenium, ruthenium compounds, copper-manganese alloys, and copper-manganese-silicon oxide alloys.

20. The metal polishing slurry according to claim 8, wherein the interlayer dielectric layer is a silicon-coating film or an organic polymer film.

21. The metal polishing slurry according to claim 9, wherein the interlayer dielectric layer is a silicon-coating film or an organic polymer film.

* * * * *